(12) United States Patent
Klein et al.

(10) Patent No.: US 8,399,852 B2
(45) Date of Patent: Mar. 19, 2013

(54) SYSTEMS AND METHODS FOR CONTROL OF MULTIPLE CHARGED PARTICLE BEAMS

(75) Inventors: Alexander Klein, Richmond, VA (US); Matthew Wittman, Boston, MA (US); Scott Rackey, Bedford, MA (US)

(73) Assignees: Alexander Klein, Chiang Mai, Chiang Mai (TH); Matthew Wittman, New York, NY (US)

( * ) Notice: Subject to any disclaimer, the term of this patent is extended or adjusted under 35 U.S.C. 154(b) by 0 days.

(21) Appl. No.: 13/303,941

(22) Filed: Nov. 23, 2011

(65) Prior Publication Data

US 2012/0187306 A1 Jul. 26, 2012

Related U.S. Application Data

(60) Provisional application No. 61/417,053, filed on Nov. 24, 2010.

(51) Int. Cl.
*H01J 3/07* (2006.01)
*H01J 3/14* (2006.01)
*H01J 3/18* (2006.01)
*H01J 3/20* (2006.01)
*H01J 27/51* (2006.01)

(52) U.S. Cl. ............. 250/396 R; 250/396 ML; 250/306; 250/307; 250/492.3; 250/492.2; 313/359.1; 313/361.1; 315/111.61

(58) Field of Classification Search .............. 250/396 R, 250/396 ML, 306, 307, 492.3, 492.2; 313/359.1, 313/361.1; 315/111.61
See application file for complete search history.

(56) References Cited

U.S. PATENT DOCUMENTS

| 7,253,417 | B2 * | 8/2007 | Frosien et al. | 250/396 R |
| 7,601,972 | B2 * | 10/2009 | Nakasuji et al. | 250/441.11 |
| 7,872,240 | B2 * | 1/2011 | Ito et al. | 250/396 R |

* cited by examiner

*Primary Examiner* — Nikita Wells
(74) *Attorney, Agent, or Firm* — Choate, Hall & Stewart LLP

(57) ABSTRACT

The systems and methods described herein relate to the use of electrostatic elements or combinations of electrostatic and magnetic elements to confine charged particles in stable recirculating, trapped orbits. More particularly, the invention relates to systems and methods for acceleration and focusing of multiple charged particle beams having multiple energies and arbitrary polarities along a common axis.

22 Claims, 10 Drawing Sheets

SYSTEMS AND METHODS FOR CONTROL OF MULTIPLE CHARGED PARTICLE BEAMS

RELATED APPLICATION

This application claims priority to and the benefit of, and incorporates herein by reference in its entirety, U.S. Provisional Patent Application No. 61/417,053, which was filed on Nov. 24, 2010.

FIELD OF THE INVENTION

The present invention relates, generally, to electrostatic systems and methods for charged particle beam generation, acceleration, focusing, and/or trapping. More particularly, various embodiments relate to devices employing advantageous magnetic and electrostatic design configurations for increased ion and/or electron currents and powers and reduced energy loss.

BACKGROUND OF THE INVENTION

Charged particle beams have a myriad of uses in science and industry. In many applications, great effort is made to maximize the current and/or power in a beam. In the semiconductor industry, for example, ion implanters utilize ion beams to dope semiconducting substrates. Such implanters typically cost several million dollars each.

Given this high cost, it is important that such machines are able to process as many substrates (e.g. silicon wafers) as possible per unit of time, so that the capital cost of the implanter can be amortized over a large number of wafers. The processing rate of an implanter is set by the beam current because each substrate requires a specific fluence. Higher beam currents deliver the same fluence in less time. Thus, higher beam currents result in faster processing per wafer and thereby less cost per wafer.

As another example, charged particle beams are also used in the medical field, where energetic proton beams are routinely used to kill tumors in vivo. Such machines accelerate protons (i.e. hydrogen ions) to high energy and then direct the beam to the specific area of a tumor within a patient. Controlling the proton energy allows the physician to control the precise depth where most of the energy of the proton beam will be deposited. By carefully focusing and sweeping the beam while at the same time regulating its energy, a physician is able to precisely deliver enough localized energy to destroy the tumor while minimizing the damage to adjacent healthy tissue. As with semiconductor ion implantation, a specific fluence (aka "dose") of protons must be delivered to the tumor, often at multiple energies. Increasing beam current has the potential to increase patient throughput and thereby cost per patient, while at the same time reducing patient discomfort during the procedure.

Those skilled in the art will recognize that there are many other uses of charged particle beams including, for example, materials analysis, materials processing, neutron/radiation generation, nuclear research, and mass spectrometry, to name a few.

As will be discussed in more detail herein below, in one aspect, the invention relates to the use of electrostatic elements or combinations of electrostatic and magnetic elements to confine charged particles in stable recirculating, trapped orbits. Charged particle traps have existed in certain forms for some time. For example, Penning traps use a combination of magnetic and electrostatic fields to confine charged particles of one particular polarity, and the Paul trap uses alternating electric fields for confining charged particles. Purely electrostatic traps have also been developed, as is evidenced by the work at the Weizmann Institute in Israel [H. B. Pedersen et al, *Physical Review A*, V65, p042703 (2001)] and Stockholm University in Sweden [H. T. Schmidt, Nuclear Instruments and Methods in Physics Research B 173 p523 (2001)]. In essence, these linear traps confine a population of charged particles (typically ions) on stable recirculating orbits within an effective potential well. Ions within a range of kinetic energies bounce between electrostatic mirrors, and focusing elements ensure bounded orbits. In this manner, such devices are reminiscent of stable laser cavities as found in photon optical systems. Typically, the optical properties of these electrostatic traps are such that only particles within a specific and narrow range of energies possess stable orbits. These electrostatic trapping techniques have been developed mainly for use in time of flight mass spectrometry. Particles with different masses but identical kinetic energies will have different orbital periods. Such periods can be measured very accurately, thereby allowing a very accurate measurement of particle mass. Charged particle traps typically store only a limited number of charged particles because, as space charge accumulates, their own Coulomb repulsion distorts the fields of the trap, thereby allowing particles to escape the trap. It will be recognized, by those skilled in the art, that charged particle traps have numerous applications besides mass spectrometry, and that increasing the amount of charge and the range of kinetic energies that can be stored in such traps is of utility.

Also as will be discussed in more detail herein below, in certain embodiments, the invention is directed to improvements to the class of fusion devices based on inertial electrostatic confinement ("IEC"). At present, IEC fusion devices are sold commercially as neutron sources and are also being developed for short-lived isotope production. Neutron sources are used commercially for materials research, detection of fissile materials in shipping containers, and measurement of oil bearing strata about the location of an oil well (known as "well logging"). Certain embodiments of the present invention are directed to greatly increasing the total current impinging upon the core of an IEC device, which increases the useful output of such devices.

Early work by researchers such as Hirsch [R. Hirsch, *Journal of Applied Physics* 38, p 4522 (1967)], Hu [K. M. Hu & E. H. Klevans, Physics of Fluids, 17, p227 (1974)], Swanson and Verdeyen [Swanson, Ph.D. Thesis, U. of Illinois (1975)], and more recent results by Matsuura [H. Matsuura, K. Funakoshi and Y. Nakao, *Nuclear Fusion* 43, p989 (2003)] and Meyer [R. M. Meyer, *IEEE Transactions on Plasma Science* 35, p354 (2007)], investigates virtual electrode formation in spherical IEC devices, and a "multiple well" hypothesis has been proposed. The density profile of such a multiple well is illustrated in FIG. 1. The existence of "Poissors" has been somewhat conjectural, but of great interest because current and density levels in beam-fusion devices might theoretically be raised to useful fusion power producing levels. The general consensus on Poissors is that they might form spontaneously under certain conditions. In all the IEC devices and concepts of the past 40 years, only ions (IXL) or only electrons (EXL, Polywell) are accelerated by potentials on real electrodes, set by one power supply, but never both ions and electrons. Particles of the opposite polarity from the main injection species are envisioned to be confined and/or accelerated via the space charge of the injected species.

Preferred embodiments of the present invention, described in detail herein below, feature the focusing of multiple, ambipolar charged particle beams. There have been some applications where electrons and ions are sent through a common optical element in order to achieve a focused, largely neutral beam, but there are significant differences between these earlier approaches and the embodiments of the present invention.

Beam neutrality is important to prevent the electrostatic charging of various targets, and to prevent beam spreading due to space charge effects. One example is found in beam microscope technologies. The intent of this approach is to merge an electron beam and an ion beam at different energies and then to pass the merged beam through a final lens system that focuses each beam together by way of their difference in energies [H. Liebl, *International Journal of Mass Spectrometry and Ion Physics* 6, p4-01 (1971)]. Such a system is illustrated in FIG. 2. Another application involves micromachining using focused and neutralized ion beams [P. W. Ho de Jager et al, Microelectronic Engineering 30, p4-27 (1996)], where an electron beam and an ion beam are merged to form a neutralized beam devoid of net charge build-up. The 'ambipolar' lenses used in such systems can be of magnetic or electrostatic nature or a combination of both [J. R. A. Cleaver & H. Ahmed, *J. Vac. Sci. Technol.* B 3, 144 (1985)].

A series of focusing and defocusing elements in a beam line can have a net focusing effect on both negative and positive charged particles. Such an arrangement can be achieved with magnetic or electrostatic multipoles, or by using a collection of alternating Einzel lenses or a series of electrostatic immersion lenses. The principle is referred to "alternating-gradient" or "strong focusing" and is used in many accelerators today. It is important to note that the focusing takes place regardless of the sign of the charge of the particles, so ions and electrons can both experience focusing along a common beam line.

Ambipolar beam implementations have also been used to increase the current and power carrying capabilities of charged particle beams. The current that may be extracted and transmitted in a beam optical system is limited by space charge considerations, the so-called "Child-Langmuir" limit (alternatively referred to herein as the "CL limit"). This is the limiting current at which a given stream of charged particles may flow in a given external electrostatic field before the space charge of the particles themselves negates the external field and prevents additional current. In addition, secondary effects, such as instabilities, often limit practically attainable beam currents substantially below the Child-Langmuir limit. The use of beams of dual polarity allows current to be increased far beyond what is possible for single polarity ion or electron systems, due to the neutralization of electric charge.

SUMMARY OF THE INVENTION

It is an object of this invention to provide systems and methods to accelerate and focus multiple charged particle beams having multiple energies and arbitrary polarities (e.g., ambipolar) along a common axis.

The systems and methods described herein generally relate to the use of electrostatic elements or combinations of electrostatic and magnetic elements to confine charged particles in stable recirculating, trapped orbits. In certain embodiments, the invention is directed to improvements to the class of fusion devices based on inertial electrostatic confinement ("IEC"). Through use of the systems and methods described herein, it is possible to greatly increase the total current impinging upon the core of an IEC device, thereby increasing the useful output of such a device.

In certain embodiments, the invention allows both positively charged particles and negatively charged particles to be explicitly and directly controlled by real, not virtual, electrodes connected to power supplies. Single or multiple virtual electrodes are directly established via the application of potentials to nearby physical electrodes, as well as by direct injection of electron beams. Such potential wells may be controlled such that their depth may be set and their locations established.

The inventors have made several important discoveries leading to the claimed invention. It has been discovered that both ions and electrons can be trapped by purely steady state electrostatic means, an unexpected result in light of the charge differences between such particles. It has also been discovered that simple electrostatic traps can be designed which contain not only one relatively small volume in phase space which exhibits trapping, but several such regions. Thus, it is possible to have devices that focus and/or trap a great number of overlapping beams. Furthermore, it is found that multiple negative and positive particle beams can be contained in purely electrostatic traps.

Thus, not only can large trapped currents be facilitated in recirculating beam IEC devices, but also, beam currents and power produced in a variety of charged particle accelerators can be increased using the systems and methods described herein, without regard for particle trapping or circulation.

In one aspect, the invention is directed to the combination of an array of electrostatic and/or magnetic elements capable of strong focusing, such as a series of electrostatic immersion lenses, disposing such elements along a single beam line, biasing such focusing elements in such a way that particles are accelerated, and then combining such array of focusing elements with a series of sources of charged particles located at preferred regions about the beam line. Such a system can be used to both accelerate and focus multiple beams of different energies along the same beam line.

This approach can also be used to decelerate multiple beams of different energies emanating from the core region. By mirroring such an array of focusing elements about the core, it is possible to build a system which "traps" charged particles on stable recirculating orbits. This approach enables the simultaneous trapping of multiple beams at widely disparate energies within the same ion trap.

Another object of the present invention is to simultaneously accelerate and focus both positively charged and negatively charged particles in the same beam line. In certain embodiments, this is done by controlling the potential profile along the beam axis so that both positively charged and negatively charged particles have a non-zero kinetic energy upon reaching the outlet of the beam line and at all places between their respective introduction regions and the outlet region. In other words, the potential profile along the beam line is shaped such that, for any given positive particle introduction region, the potential between the outlet region and the introduction region is always less positive than the potential of said positive particle introduction region, and the converse for a given negative particle introduction region.

In certain embodiments of the invention, a beam of primarily negatively charged particles is made to pass through one or more positively charged particle introduction regions. This has the effect that the space charge of the negatively charged particle beam will partially neutralize the space charge of the positively charged particles. Because the current emitted from a source of charged particles may be Child-Langmuir limited, such neutralization serves to increase the total amount of current that may be extracted from a given source of charged particles in the presence of a given field strength. Furthermore, both beams will proceed together to the beam outlet; and, therefore, their respective space charges will continue to cancel, at least to some extent, beyond the ion introduction region. Such space charge cancellation may be used to prevent beam instabilities that might occur had only positive or only negative particles been accelerated.

The strategy described herein for the ambipolar acceleration and focusing of multiple beams toward an outlet region can also be used to decelerate multiple beams of both negative and positive particles emanating from an outlet region. Such a system may be mirrored about the outlet region to create a trap to confine charged particles of either polarity on stable recirculating orbits. In this case, the trap confines multiple beams of both positively and negatively charged particles.

In certain embodiments of the invention involving trapping of charged particle beams on recirculating orbits, the focusing element configuration is advantageously structured in such a way as to minimize energy loss from particles that find their way to unstable orbits (e.g. due to Coulomb scattering). Because particles will be lost from recirculating traps at some finite rate, and because a finite power input is required to ionize additional particles at some finite rate, trapping a finite current requires some input power, which generally will eventually manifest itself as heat caused by charged particle impact on electrodes. In some applications (e.g. neutron sources and IEC fusion), it is particularly important to minimize the amount of input power necessary for a given trapped current, in order to reduce wear on surfaces and to optimize efficiency. One method to minimize energy losses associated with particles escaping from confinement is to design the system of focusing elements such that particles on unstable orbits are decelerated as much as possible prior to impacting solid structures. One such approach is to arrange the focusing elements in a monotonic series of potentials (or at least arranging the focusing elements that a particle is likely to hit in a monotonic series of potentials) so that an unstable particle is most likely to collide with next lowest energy focusing element in the series. Thus, instead of losing the full difference in energy between the birth potential of the particle and the potential in the core or outlet regions, only the difference in energy between the birth potential and the next lower energy element is lost.

In certain embodiments of the invention, it is desirable to create a potential profile where only positively charged particles or only negatively charged particles are accelerated to the outlet region or, in the case of recirculating charged particle traps, through the core region. However, such systems may be tailored to have potential profiles such that charged particles are also confined on "local" recirculating orbits that do not pass through the outlet region, or in the case of charged particle traps, through the core region.

The above-described approaches of particle confinement have been limited to confining particles of finite energy on stable orbits via the use of electrostatic focusing optics. Such systems typically require that particles have specific energies to be confined on stable orbits. Particles with too much or too little energy will be lost. However, low energy particles can also be well confined by adding a solenoidal magnetic field that is substantially parallel to the beam line near the potential extrema of the arrangement. For example, near a potential maximum, electrons can be axially confined by the potential and radially confined by a coaxially oriented magnetic field. For example, particle traps, such as Penning traps may be implemented. Penning traps confine particles of a particular polarity using both magnetic and electrostatic elements. If the magnetic field and electrostatic potential well are sufficiently strong, particles below a specific energy threshold can be confined for very long periods. Such systems work particularly well for electrons because their mass-to-charge ratio is very low and they are thus strongly affected by magnetic fields (as compared to more massive ions).

Various methods of introducing charged particles into the particle introduction regions described above are presented herein. For example, charged particles may be introduced directly into such regions with little or no kinetic energy, or they may be introduced into the system in the form of beams, accomplished with a temporary switching of electrode potentials that allows said beams to enter the scenario.

In certain embodiments, charged particles are directly created with near-zero kinetic energy within the reflection regions of the trap by ionization of a neutral gas. In this way, it can be assured that charged particles are always located relatively far from any solid physical elements of the system. In the trap embodiments of the present invention, with charged particles oscillating from one end of the trap to the other, particles on stable orbits, subject to conservative electromagnetic fields, will eventually return arbitrarily close to their birth position in phase space. Small changes in trajectories due to non-conservative forces (such as resulting from collisions with other particles or radiation) imply that particles will generally return near their birth potential/location, but not exactly. Therefore, introduction of particles far from any physical structure is advantageous, because particles are very unlikely to contact such structures when experiencing small non-conservative perturbations in their motion. Thus, in certain embodiments, charged particles are created well away from physical elements by ionization of a neutral gas that may be present about the beam line. Such ionization can be achieved through several different means, e.g. electrical discharge, electron impact ionization, or bombardment by photons of appropriate energy and intensity.

In one aspect, the invention provides a system for generating, accelerating, focusing, and/or trapping of particle beams, the system comprising a plurality of electrostatic and/or magnetic focusing elements arranged along a beam line and a plurality of positively charged particle introduction regions arranged along said beam line such that, during operation, the potential of each successive positive particle introduction region is substantially more positive than any other potential along the beam line in the direction of an outlet region.

In another aspect, the invention provides a system for generating, accelerating, focusing, and/or trapping of particle beams, the system comprising a plurality of electrostatic and/or magnetic focusing elements arranged along a beam line and a plurality of negatively charged particle introduction regions arranged along said beam line such that, during operation, the potential of each successive negative particle introduction region is substantially more negative than any other potential along the beam line in the direction of an outlet region.

In yet another aspect, the invention provides a system for generating, accelerating, focusing, and/or trapping of particle beams, the system comprising a plurality of electrostatic and/or magnetic focusing elements arranged along a beam line and a plurality of positively charged particle introduction regions arranged along said beam line such that, during operation, the potential of each successive positive particle introduction region is substantially more positive than any other potential along the beam line in the direction of outlet region and a series of negatively charged particle introduction regions arranged along said beam line such that the potential of each successive negative particle introduction region is substantially more negative than any other potential along the beam line in the direction of an outlet region.

In certain embodiments of any of the above systems, the positive particle introduction region lies about and toward the outlet region of a local maxima in potential on the beam line. In certain embodiments, the negative particle introduction region lies about and toward the outlet region of a local minima in potential on the beam line.

In certain embodiments, during operation, two or more charged particle beams of disparate energies are accelerated and focused along the same beam line to the same outlet region. In some embodiments, two or more charged particle beams of opposite polarity are accelerated and focused along the same beam line to the same outlet region.

In yet another aspect, the invention provides a system for generating, accelerating, focusing, and/or trapping of particle beams, the system comprising a plurality of electrostatic and/or magnetic focusing elements arranged along a beam line and a plurality of positively charged particle introduction regions arranged along said beam line such that, during operation, one or more of the following holds: (i) the potential of each successive positive particle introduction region is substantially more positive than any other potential along the beam line in the direction of outlet region; (ii) the positive particle introduction regions lie about and toward the outlet region of a local maxima in potential on the beam line; (iii) the potential between one or more adjacent pairs of positive particle introduction regions falls to one or more local minima; and/or (iv) all local minima in potential along the beam line are substantially the same.

In certain embodiments, during operation, one or more of the following apply: all local minima are substantially equal to the potential of the outlet region; a source of electrons is provided at a potential minima furthest from the outlet region; and/or electrons are confined on local recirculating orbits between adjacent potential minima.

In certain embodiments, the system further comprises one or more magnetic elements configured to generate a magnetic field that is substantially parallel to at least a portion of the beam line. In some embodiments, during operation, at least some electrons are confined in Penning confinement regions about one or more local potential maxima; and/or electrons create ions through impact with neutral gas. In certain embodiments, said created ions are created in locations where they can be accelerated and focused to the outlet region.

In certain embodiments, any of the above systems are mirrored and/or symmetrical about the outlet region such that, during operation, one or more beams are at least partially confined on stable recirculating orbits traveling through a core region. In certain embodiments, two or more beams of opposite polarity are at least partially confined on stable recirculating orbits traveling through the core region.

In yet another aspect, the invention is directed to a method for generating, accelerating, focusing, and/or trapping particle beams, the method comprising the step of introducing positively charged particles into a beam line, wherein a plurality of electrostatic and/or magnetic focusing elements are arranged along the beam line and a plurality of positively charged particle introduction regions are arranged along said beam line, such that the potential of each successive positively charged particle introduction region is substantially more positive than any other potential along the beam line in the direction of an outlet region.

In yet another aspect, the invention is directed to a method for generating, accelerating, focusing, and/or trapping particle beams, the method comprising introducing negatively charged particles into a beam line, wherein a plurality of electrostatic and/or magnetic focusing elements are arranged along the beam line and a plurality of negatively charged particle introduction regions are arranged along said beam line, such that the potential of each successive negative particle introduction region is substantially more negative than any other potential along the beam line in the direction of an outlet region.

In yet another aspect, the invention is directed to a method for generating, accelerating, focusing, and/or trapping particle beams, the method comprising introducing charged particles into a beam line, wherein a plurality of electrostatic and/or magnetic focusing elements are arranged along the beam line and a plurality of positively charged particle introduction regions are arranged along said beam line, wherein the potential of each successive positive particle introduction region is substantially more positive than any other potential along the beam line in the direction of an outlet region, and wherein a plurality of negatively charged particle introduction regions are arranged along said beam line such that the potential of each successive negative particle introduction region is substantially more negative than any other potential along the beam line in the direction of an outlet region.

In certain embodiments of any of the methods above, the positive particle introduction region lies about and toward the outlet region of a local maxima in potential on the beam line and/or the negative particle introduction region lies about and toward the outlet region of a local minima in potential on the beam line. In certain embodiments, wherein two or more charged particle beams of disparate energies are accelerated and focused along the same beam line to the same outlet region; and/or two or more charged particle beams of opposite polarity are accelerated and focused along the same beam line to the same outlet region.

In yet another aspect, the invention is directed to a method for generating, accelerating, focusing, and/or trapping particle beams, the method comprising introducing charged particles into a beam line, wherein a plurality of electrostatic and/or magnetic focusing elements are arranged along the beam line and a plurality of positively charged particle introduction regions are arranged along the beam line such that one or more of the following holds: (i) the potential of each successive positive particle introduction region is substantially more positive than any other potential along the beam line in the direction of outlet region; (ii) the positive particle introduction regions lie about and toward the outlet region of a local maxima in potential on the beam line; (iii) the potential between one or more adjacent pairs of positive particle introduction regions falls to one or more local minima; and/or (iv) all local minima in potential along the beam line are substantially the same.

In certain embodiments, all local minima are substantially equal to the potential of the outlet region. In certain embodiments, a source of electrons is provided at a potential minima furthest from the outlet region. In some embodiments, electrons are confined on local recirculating orbits between adjacent potential minima.

In certain embodiments, the method further includes the step of generating a magnetic field that is substantially parallel to at least a portion of the beam line. In certain embodiments, at least some electrons are confined in Penning confinement regions about one or more local potential maxima. In certain embodiments, electrons create ions through impact with neutral gas. In certain embodiments, the created ions are created in locations where they can be accelerated and focused to the outlet region.

In certain embodiments, one or more particle beams are at least partially confined on stable recirculating orbits traveling through a core region. In some embodiments, two or more beams of opposite polarity are at least partially confined on stable recirculating orbits traveling through the core region.

Elements of embodiments described with respect to a given aspect of the invention may be used in various embodiments of another aspect of the invention (e.g., features of dependent claims depending from one independent claim can be used in systems and/or methods of any of the other independent claims).

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

While the invention is particularly shown and described herein with reference to specific examples and specific embodiments, it should be understood by those skilled in the art that various changes in form and detail may be made therein without departing from the spirit and scope of the invention.

DETAILED DESCRIPTION

It is contemplated that devices, systems, methods, and processes of the claimed invention encompass variations and adaptations developed using information from the embodiments described herein. Adaptation and/or modification of the devices, systems, methods, and processes described herein may be performed by those of ordinary skill in the relevant art.

Throughout the description, where devices and systems are described as having, including, or comprising specific components, or where processes and methods are described as having, including, or comprising specific steps, it is contemplated that, additionally, there are devices and systems of the present invention that consist essentially of, or consist of, the recited components, and that there are processes and methods according to the present invention that consist essentially of, or consist of, the recited processing steps.

It should be understood that the order of steps or order for performing certain actions is immaterial so long as the invention remains operable. Moreover, two or more steps or actions may be conducted simultaneously.

The mention herein of any publication, for example, in the Background section, is not an admission that the publication serves as prior art with respect to any of the claims presented herein. The Background section is presented for purposes of clarity and is not meant as a description of prior art with respect to any claim. The relevant portions of the references mentioned herein are hereby incorporated by reference.

Headers are provided herein for the convenience of the reader and are not meant to limit interpretation of the recited elements of the claims.

The terms "optics" and "ion optics" and "electron optics" are used interchangeably herein, and in the context of descriptions herein, refer to charged particle optics, i.e. the manipulation of the trajectories of charged particles using electric and/or magnetic fields.

The optical properties of beam systems are invariant with scale. Thus, physical scales of example ion optical systems need not be presented in this description. No illustrations herein are necessarily to scale.

Multiple Beam Acceleration and Focusing on Common Beam Axis

Figure 4:
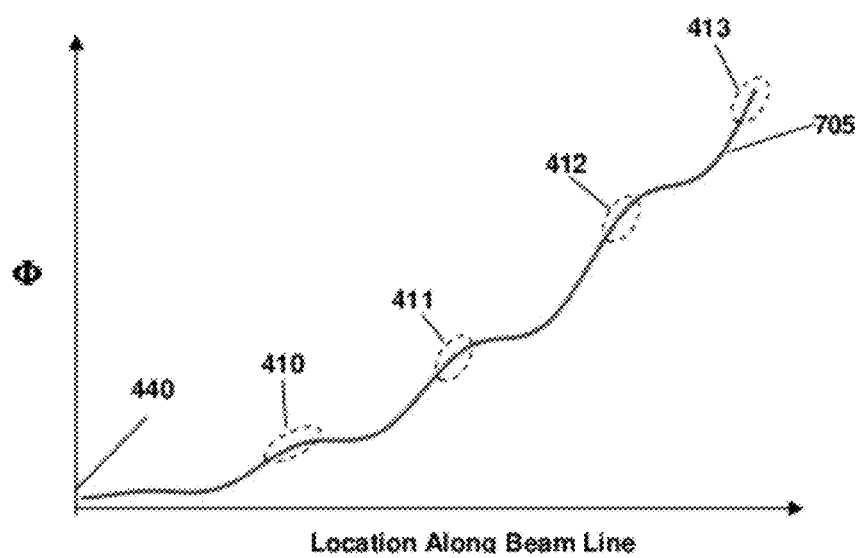
FIG. 4 is a plot of potential along a beam line for a multi-beam acceleration and focusing device, according to an illustrative embodiment of the invention.
Figure 5:
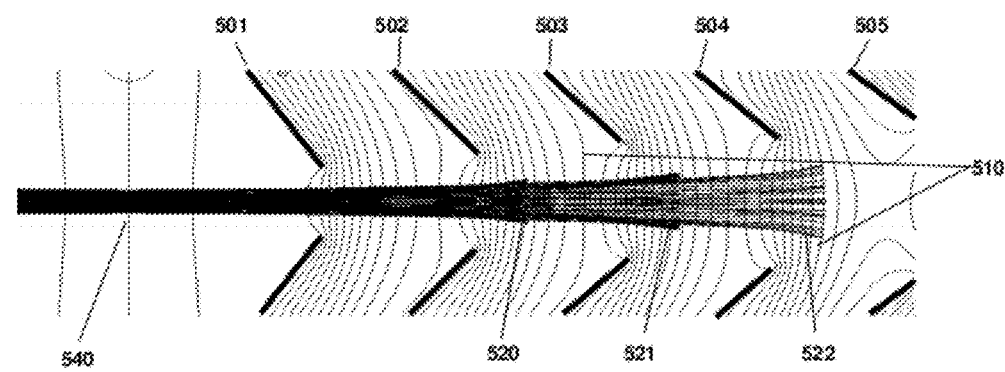
FIG. 5 is graphical output of a cylindrically symmetric computational simulation of a multi-beam acceleration and focusing device, according to an illustrative embodiment of the invention.

An embodiment of the present invention is the combination of an array of electrostatic and/or magnetic elements capable of strong focusing, such as a series of electrostatic immersion lenses, disposing such elements along a single beam line, biasing such focusing elements in such a way that particles are accelerated, and then combining such array of focusing elements with a series of sources of charged particles located at preferred regions about the beam line. Such a system can be used to both accelerate and focus multiple beams of different energies along the same beam line. FIG. 4 illustrates the potential (commonly represented as $\Phi$) along the beam line axis for such a system, for positive (ion) beams. The same scheme applies to negative particles if the polarities of the potentials are simply reversed. The outlet region of such a system is highlighted as 440, and the region where positively charged particles are introduced are shown as regions 410, 411, 412, and 413. The ion introduction regions are located along the beam line such that particles released from such a region will have sufficient potential energy relative to the outlet region to be accelerated to the outlet region 440. Thus, in preferred embodiments of the invention, for any given positive charged particle introduction region, the potential along the beam line between the outlet region and the said introduction region will always be less positive. For example, FIG. 5 depicts the trajectories of charged particles as produced by a computer model of one embodiment of the present invention. The model is cylindrically symmetric about the beam axis, which is horizontal about the center of the cross section diagram. FIG. 5 shows a series of thin conical electrodes 501, 502, 503, 504, and 505 which are biased at voltages of 100V, 200V, 300V, 400V and 500V respectively. The electrostatic potential created by these electrodes is illustrated by the series of equipotential lines 510. From these, it is apparent that particles experience electrostatic lenses which alternately focus and de-focus the trajectories, with the net result of focusing for any particle. The trajectories of a set of three overlapping, coaxial ion beams are also shown. The ions are introduced to specific equipotential surfaces (or approximately about a portion of such surfaces) and then are accelerated towards the core region 540. These beams 520, 521 and 522 have energies of approximately 260 eV, 367 eV and 463 eV respectively when reaching the core region 540. As can be seen, all three beams are effectively focused to the core region despite the beams having very different energies.

This approach may be extended to include an arbitrary number of focusing elements and hence an arbitrary number of beams. In this way, higher currents may be achieved at the output of the beam line (i.e. at the core region 540) by adding multiple beams, such that the combined current at the output of the beam line exceeds the Child-Langmuir limit for any individual beam.

The converse of this approach also holds for beams of negatively charged particles. In this case, the potential profile along the beam axis and the regions of negatively charged particle introduction are such that negatively charged particles released in such a region will have sufficient energy to be accelerated to the outlet region 440. In other words, for any given negatively charged particle introduction region, the potential along the beam line between the outlet region and the said introduction region will always be less negative.

Multiple Beam Recirculating Ion Traps on Same Beam Line

The above approach, which accelerates multiple beams of different energies toward a core region 540, can also be used to decelerate multiple beams of different energies emanating from the core region 540. By mirroring such an array of focusing elements about the core, it is possible to build a system which "traps" charged particles on stable recirculating orbits. Electrostatic ion traps have existed for some time. However, one aspect of this approach enables the simultaneous trapping of multiple beams at widely disparate energies within the same ion trap.

Figure 6:
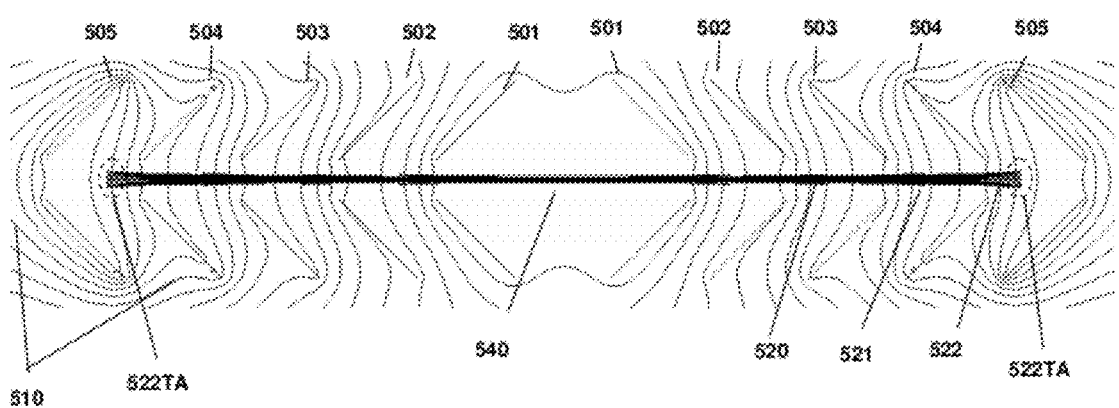
FIG. 6 is graphical output of a cylindrically symmetric computational simulation of a multi-beam charged particle trapping device, according to an illustrative embodiment of the invention.

FIG. 6 shows the recirculating version of the system described above. All biases and energies remain the same as describe above, the only difference being that each electrode is mirrored on either side of the core region. It should be noted that in recirculating traps each beam has its own reflection region where its axial velocity (i.e. velocity along the beam axis) is approximately zero. Thus, particles of a specific recirculating beam, once having passed through the core region, will eventually be decelerated to zero axial velocity at the turn around region, where they will again be accelerated back toward the core region. For those beams that are on stable orbits, such reflection regions will typically have both a finite axial and radial extent, as beams will have some finite range of axial and radial energies at the core (i.e. a finite volume of phase space that is stably trapped). The turn around region 522TA for beam 522 is highlighted on FIG. 6.

These systems may be constructed with a broad range of electrode shapes and biases as long as a series of focusing/defocusing couples is created along the beam line. Such systems will typically trap multiple charged particle beams of different energies provided they are of the same charge polarity. For example, the specific embodiment illustrated in FIG. 5 and FIG. 6 traps positive ions. One could use a similar arrangement of negatively biased electrodes to confine multiple negatively charged particle beams.

The trapped charge in such an arrangement is significantly higher than for the case of a single beam energy trapped in a single beam resonator. A comparison with the traditional laser cavity, i.e. light resonator, is warranted. In a laser cavity, light bounces between mirrored surfaces and photons with arbitrary frequency are trapped, without interfering with one another (Bose-Einstein particles). In certain embodiments of the present invention, charged particles of a particular energy are reflected from an equipotential surface. Such surfaces are permeable to higher energy particle flow, so in this manner multiple beams can be stacked along a common axis. Charged particles tend to interfere with one another, particularly when their kinetic energy is small, so that by trapping beams with a multitude of energies, the space charge interaction is reduced and large recirculating beam currents can be achieved. Whereas the laser accommodates light with a large spread in frequencies, preferred embodiments of the present invention trap beams within finite bands of energies. Particles with energies that fall outside of these energy bands do not follow stable orbits. In addition, ions with too much transverse energy at the core and/or ions that are too far way from the beam line at the core will have unstable orbits. Careful design of the optical properties of the electrodes allows the designer to increase the allowable range of axial and transverse energies that remains trapped for a given beam with a given band of energies (i.e. increase the region of trapped phase space). This in turn will have the effect of increasing the volume of the turn around regions for one beam of particles, further mitigating the effects of space charge.

In a further embodiment of the invention, the distances between turning regions and the potentials of the turning regions are arranged in a fashion such that the orbital period for all ion beams is identical or related by integer multiples. Linear electrostatic traps as described herein give rise to beam bunching and synchronization of said bunches. Certain embodiments of the present invention are configured to operate in a bunched manner such that all particle bunches arrive in the core region synchronously, thus providing high density pulses of energetic particles. This is accomplished by increasing the potential of the turning regions roughly in proportion to the square of the distance from the core volume, thus establishing a quasi-harmonic potential which has the property that particles of all energies oscillate with the same period.

In yet another embodiment of the present invention, the potentials of some or all of the electrodes that establish the electrostatic potential are temporally modified to eject all or some of the beams that have been trapped. In this way, a small but steady sourcing of charged particles can give rise to a substantial trapped charged particle population, which then can be "switched out" of the trap in the form of an intense beam pulse. This is somewhat analogous to pulsed laser technologies.

Figure 1:
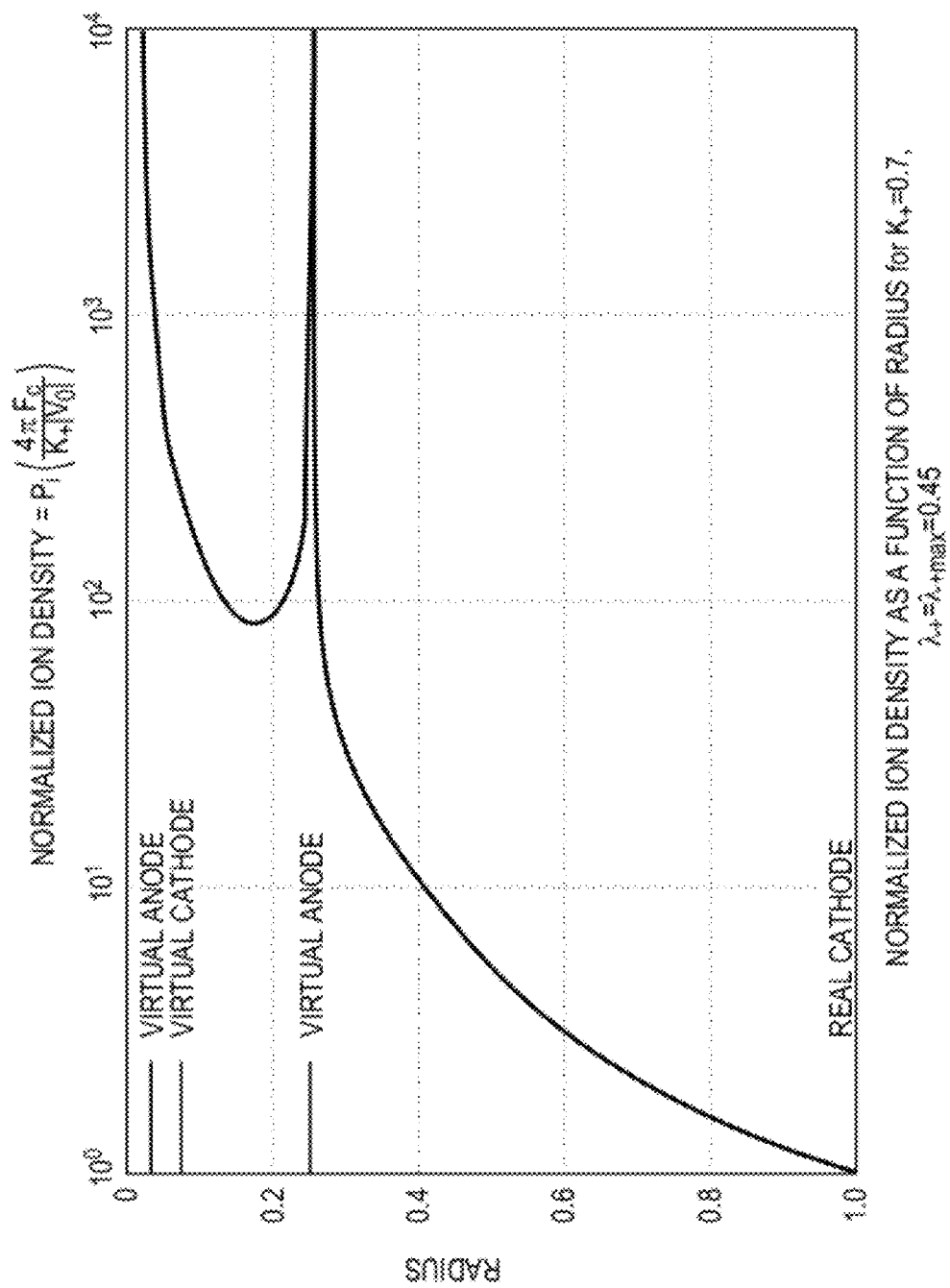
FIG. 1 is a schematic representation of ion density vs. radius in spherically symmetric ion beam acceleration device in which electrons interact with space charge to form multiple virtual electrodes.
Figure 2:
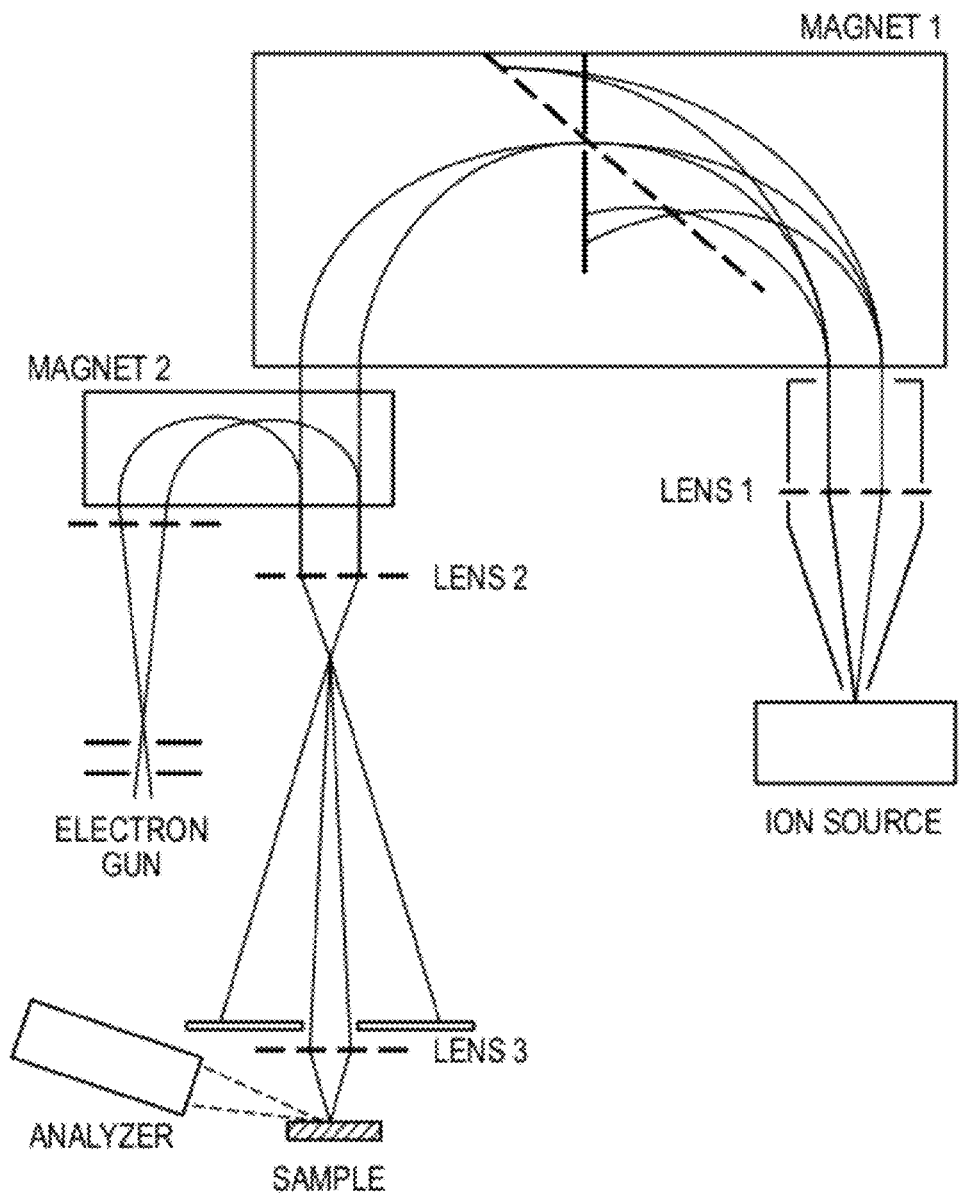
FIG. 2 is a schematic drawing of a system that merges positive and negative particle beams and focuses the combined beam using a common focusing element/lens.
Figure 3:
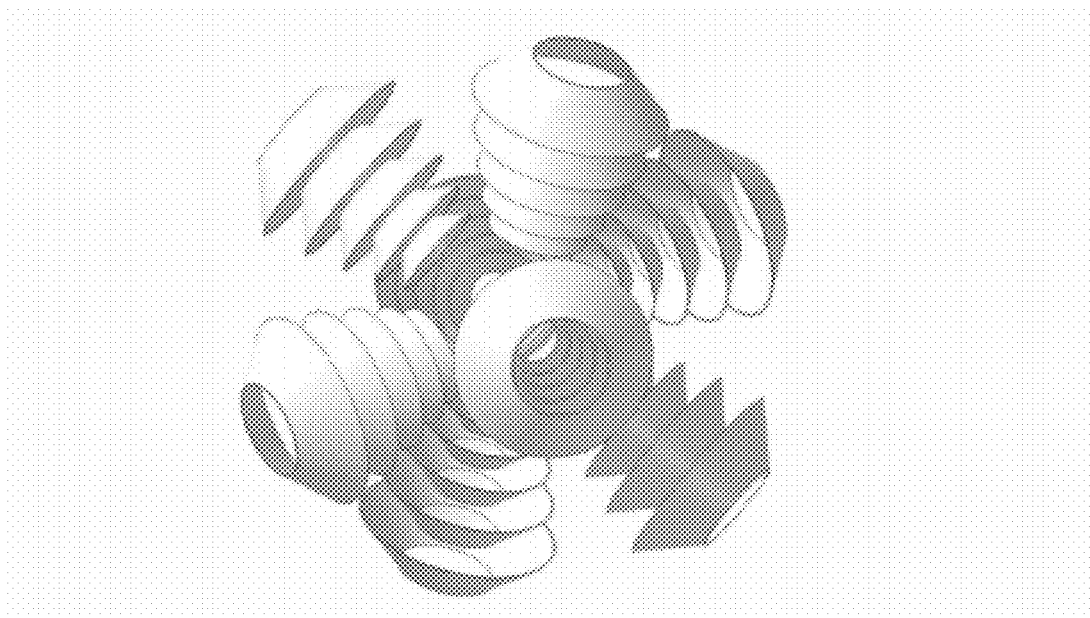
FIG. 3 is a depiction of multiple multi-beam charged particle trapping devices arranged around a common core, according to an illustrative embodiment of the invention.

Furthermore, in order to further increase the density of charged particles in a small volume (e.g. the core region), many such linearly stacked multi-beam lines as depicted in FIG. 6 may be built and arranged at angles relative to each other, but sharing a common core region. FIG. 3 shows an example of such an arrangement, where multiple stacked beam lines intersect in a quasi-spherical fashion, in this instance there are four of them. This embodiment of the invention is useful when a large number of collisional interactions between beam particles, are desired, especially at high energies.

Ambipolar Acceleration and Focusing on Same Beam Line

Figure 7:
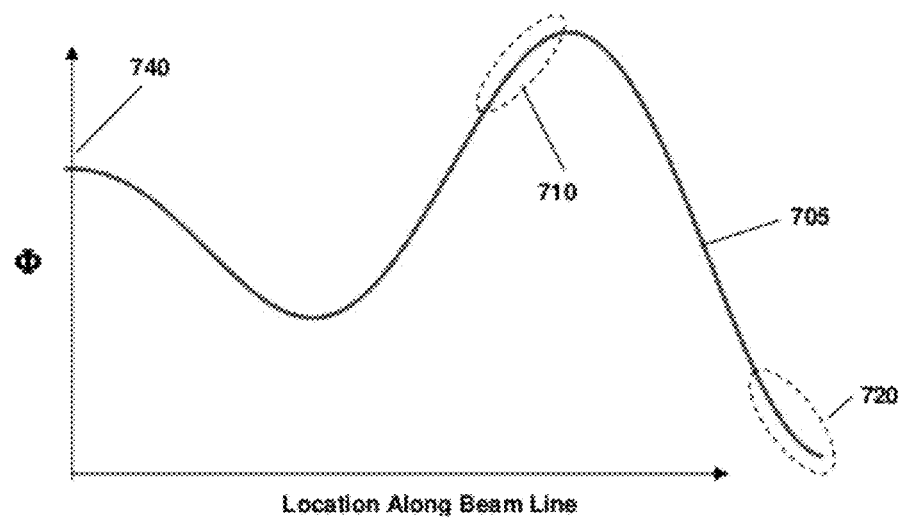
FIG. 7 is a plot of potential along a beam line for a multi-beam acceleration and focusing device for one positive and one negative beam, according to an illustrative embodiment of the invention.

Another object of the present invention is to simultaneously accelerate and focus both positively charged and negatively charged particles in the same beam line. This done by controlling the potential profile along the beam axis so that both positively charged and negatively charged particles have a non-zero kinetic energy upon reaching the outlet of the beam line and at all places between their respective introduction regions and the outlet region. In other words, the potential profile along the beam line is shaped such that, for any given positive particle introduction region, the potential between the outlet region and the introduction region is always less positive then the potential of said positive particle introduction region, and the converse for a given negative particle introduction region. A simple example of such a potential is shown in FIG. 7, which shows potential 705 versus location along a beam line. In this example, positively charged ions are introduced in one region 710 ("positive particle introduction region") along the beam line and electrons are introduced in a second region 720 ("negative particle introduction region"). It is important to note that the positive particles are released at a positive potential relative to the beam outlet 740, and the electrons are released at a negative potential relative to the beam outlet 740. Thus, both positively charged and negatively charged particles see a net acceleration toward the beam outlet 740 even though each type of particle is decelerated for part of the trajectory. Because strong focusing is effective regardless of whether a particle is being accelerated or decelerated when passing through such strong focusing lens systems, both types of particles can be focused. The potential profile and birth energy of a particle must be such that the particle sees sufficient acceleration to pass through to the beam outlet 740. If not, the particle will not have sufficient energy to reach the beam outlet 740, and will be turned back or lost.

In certain embodiments of the present invention, a beam of primarily negatively charged particles can be made to pass through one or more positively charged particle introduction regions. This has the effect that the space charge of the negatively charged particle beam will partially neutralize the space charge of the positively charged particles. Because the current emitted from a source of charged particles may be Child-Langmuir limited, such neutralization can serve to increase the total amount of current that may be extracted from a given source of charged particles in the presence of a given field strength. Furthermore, both beams will proceed together to the beam outlet 740, and therefore their respective space charges will continue to cancel, at least to some extent, beyond the ion introduction region. Such space charge cancellation may be used to prevent beam instabilities that might occur had only positive or only negative particles been accelerated. Electrons of a given energy move much faster than ions of the same energy due the electron's lower mass. This effect reduces the negative space charge of an electron beam of a given energy relative to the absolute magnitude of the space charge of a positive beam of the same energy. However, judicious design of the potential profile can allow the electron beam to be at a lower energy at the beam outlet 740 than that of the ion beam at the same location, thereby mitigating, in part, the effect of their lower mass.

Ambipolar Recirculating Ion Traps about a Common Beam Line

As with the previous example, the potential profile shown in FIG. 7 can also be used to both accelerate positively charged and negatively charged particles toward an outlet region, as well as decelerate positively charged and negatively charged particles that may be emanating from an outlet region. Because of this, a series of electrostatic elements that create the potential profile similar to that shown in FIG. 7 can be mirrored about the outlet region 740 to create a trap that is capable of confining both positively charged and negatively charged particles in stable orbits about the same beam line.

Figure 8:
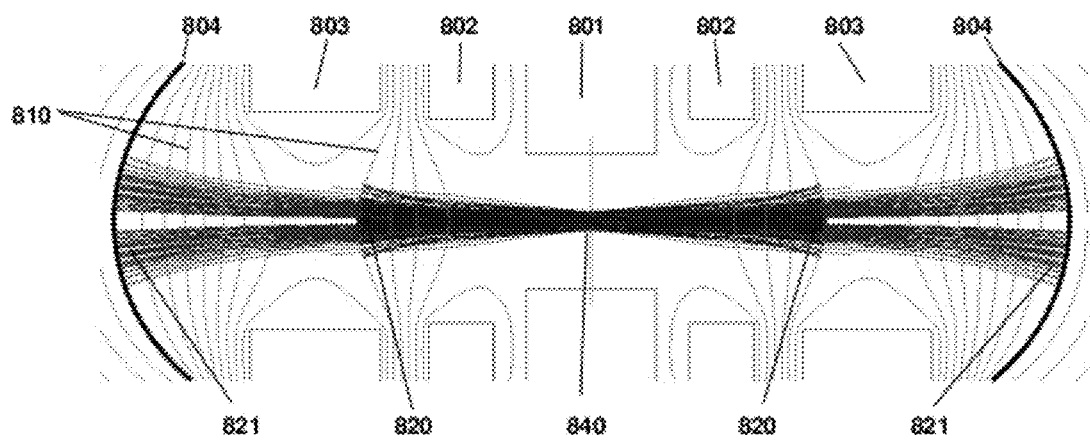
FIG. 8 is graphical output of a cylindrically symmetric computational simulation for a multi-beam charged particle trapping device confining one negatively charged particle beam and one positively charged particle beam, according to an illustrative embodiment of the invention.

An example of such a system is shown in FIG. 8. As with the previous examples, FIG. 8 shows the output of a cylindrically symmetric computational model. In this case, the model depicts the trajectories of both ions and electrons, each confined on stable orbits within an electrostatic trap. Equipotential lines 810 910 are illustrated for reference. The electrodes 801, 802, 803 and 804 901, 902, 903 and 904 have biases of −60 kV, −76 kV, 0 V, and −100 kV respectively. Electrons 821 921 are emitted near the curved surface of 804 904 with little or no kinetic energy. Ions 820 920 are released into the trap closer to the core region 840 940 about an equipotential line of around −20 kV. Thus, both the ions and electrons have energies of approximately 40 keV upon passing through the core region 840.

As discussed above, the potential profile along the beam line can be tailored so that each particle beam may have an almost arbitrary energy when passing through the core region 840. For example, one can configure the system so that ions have 60 keV of energy while electrons have only 1 keV of energy, thus resulting in greater space charge from the electron beam than would have been the case had the electron beam been at the same energy as the ions.

Ambipolar Acceleration and Focusing of Multiple Beams

Figure 9:
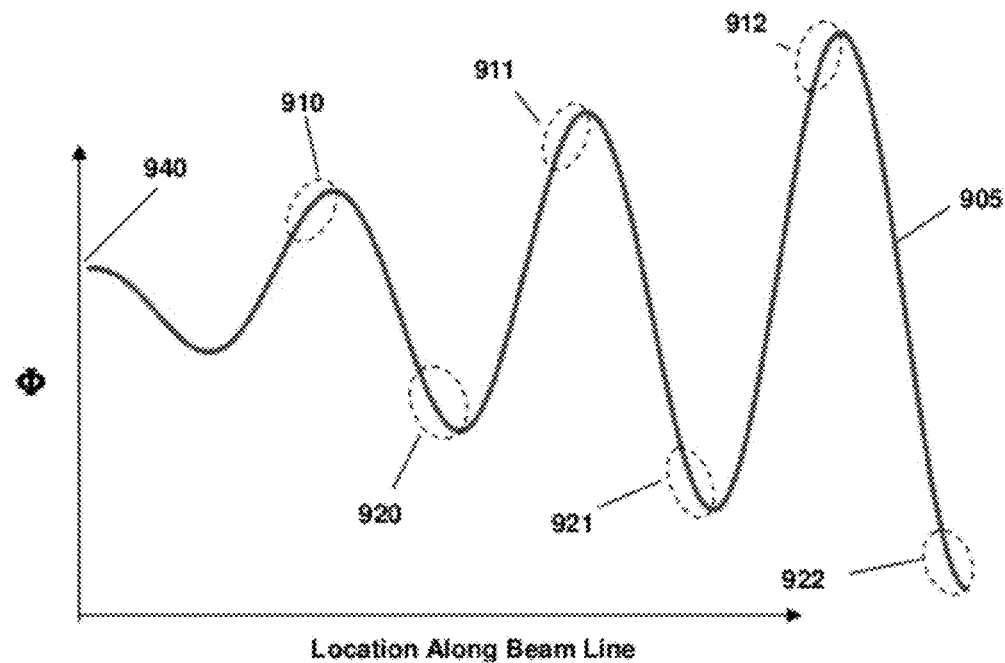
FIG. 9 is a plot of potential along a beam line for a multi-beam acceleration and focusing device for multiple positively charged particle beams and multiple negatively charged particle beams, according to an illustrative embodiment of the invention.

The ambipolar acceleration and focusing method described above can also be extended to multiple beams. FIG. 9 shows a multi-beam implementation of the ambipolar acceleration and focusing techniques illustrated in FIG. 7 and described above. FIG. 9 shows three regions 910, 911 and 912 where positively charged particles are introduced, and three regions 920, 921 and 922 where negatively charged particles are introduced. The potential is illustrated as line 905 and the outlet region is indicated as 940. It is important to note that each region 910, 911 and 912 is substantially more positive than the outlet region 940. It is similarly important to note that each region 920, 921 and 922 is substantially more negative than region 940. Furthermore, each region where positively charged particles are introduced is successively more positive than the adjacent positively charged particle introduction region closer to the outlet region 940. For example, 911 is more positive than 910, and 912 is more positive than 911. Conversely, each negatively charged particle introduction region is more negative than the adjacent region closer to the core. More generally, the potential profile along the beam line is constructed in such a way, and the regions of particle introduction are located along the beam line in positions such that, each particle regardless of charge has sufficient energy to reach the outlet region 940 with finite energy despite being partially decelerated one or more times on the way to the outlet region. It should be noted that positive particle introduction region, for those particles that are intended to be accelerated to the outlet region 940, are advantageously located near and toward the outlet region of the local maxima in the potential profile. Conversely, negative particle introduction regions are advantageously located near and toward the outlet region of the local minima in the potential profile. Particles introduced near a respective maxima or minima, but on the far side of the maxima or minima away from the outlet region, will either be locally trapped on stable orbits about a local potential minima (in the case of positively charged particles) or about a local potential maxima (in the case of negatively charged particles), or will be lost due to unbound orbits. As with the above approaches, ambipolar acceleration and focusing of multiple beams requires a series of electrostatic focusing elements arranged such that particles of each charge and each energy are focused about the beam line, in addition to the potential profile and particle introduction region method describe above.

The above described technique can be used to accelerate and focus an arbitrary number of beams, and moreover that such a strategy of incorporating both positive and negative beams can be used to reduce space charge effects and thereby increase total current at the outlet region to levels much higher than those possible with a single beam.

Ambipolar Recirculating Ion Traps of Multiple Beams on the Same Beam Line

Figure 10:
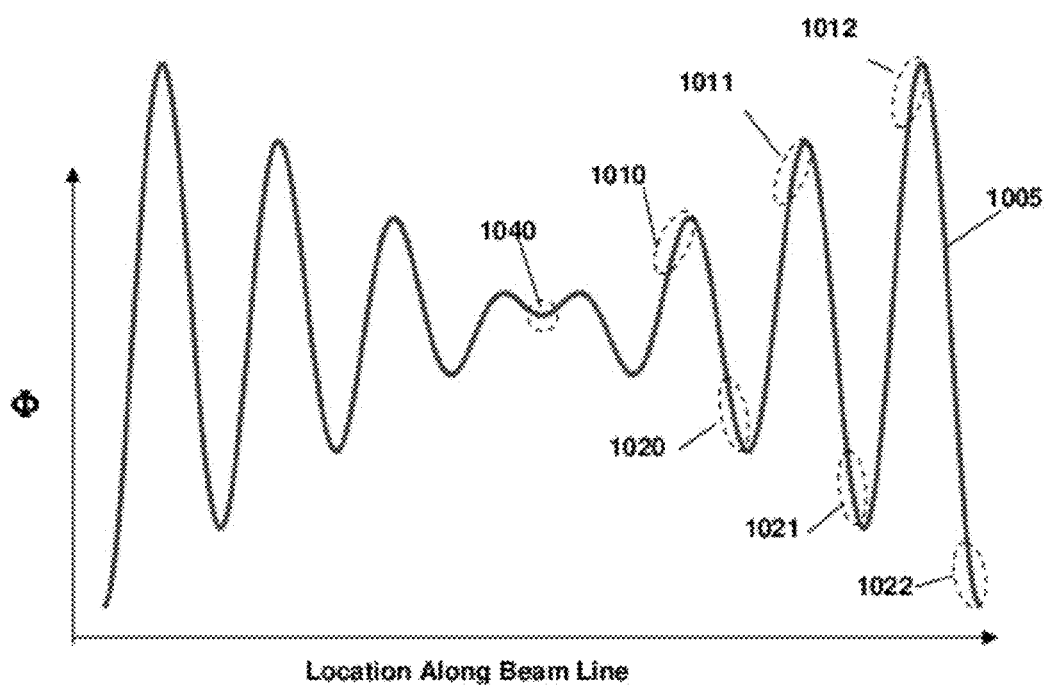
FIG. 10 is a plot of potential along a beam line for a multi-beam charged particle trapping device for multiple positively charged particle beams and multiple negatively charged particle beams, according to an illustrative embodiment of the invention.
Figure 11:
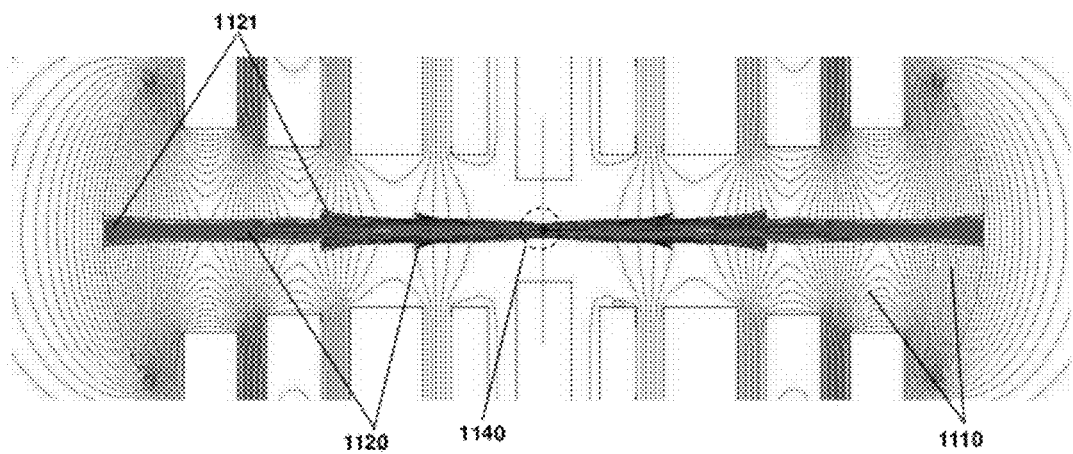
FIG. 11 is graphical output of a cylindrically symmetric computational simulation for a multi-beam charged particle trapping device confining multiple negatively charged particle beams and multiple positively charged particle beams, according to an illustrative embodiment of the invention.

As with the previous examples, the strategy described above for the ambipolar acceleration and focusing of multiple beams toward an outlet region can also be used to decelerate multiple beams of both negative and positive particles emanating from an outlet region. Just as above, such a system may be mirrored about the outlet region to create a trap to confine charged particles of either polarity on stable recirculating orbits. In this case, the trap confines multiple beams of both positively and negatively charged particles. FIG. 10 illustrates the potential profile 1005 of such a trap and indicates the particle introduction regions. Following the conventions of the previous examples, the positive particle introduction regions are 1010, 1011 and 1012, and the negative particle introduction regions are 1020, 1021 and 1022. The core region of trap is 1040. An example of such a system is shown in FIG. 11. As with the previous examples, FIG. 11 depicts the trajectories from the output of a cylindrically symmetric computational model. In this case, the model shows both positively charged ions 1120 and electrons 1121 confined on stable orbits within an electrostatic trap. Equipotential lines 1110 are illustrated for reference. The core region is denoted as 1140.

Such an approach may be used to confine an arbitrary number of beams of both negatively charged and positively charged particles, and moreover, such a strategy incorporating both positive and negative beams can be used to overcome space charge limitations, and thereby increase total recirculating current passing through the core region 1040 to levels potentially far higher than those possible with a single beam.

Charged Particle De-Selection

In certain embodiments of the invention involving trapping of charged particle beams on recirculating orbits, the focusing element configuration is advantageously structured in such a way as to minimize energy loss from particles that find their way to unstable orbits (e.g. due to Coulomb scattering). Because particles will be lost from recirculating traps at some finite rate, and because a finite power input is required to ionize additional particles at some finite rate, trapping a finite current requires some input power, which generally will eventually manifest itself as heat caused by charged particle impact on electrodes. In some applications (e.g. neutron sources and IEC fusion), it is particularly important to minimize the amount of input power necessary for a given trapped current, in order to reduce wear on surfaces and to optimize efficiency. One method to minimize energy losses associated with particles escaping from confinement is to design the system of focusing elements such that particles on unstable orbits are decelerated as much as possible prior to impacting solid structures. One such approach is to arrange the focusing elements in a monotonic series of potentials (or at least arranging the focusing elements that a particle is likely to hit in a monotonic series of potentials) so that an unstable particle is most likely to collide with next lowest energy focusing element in the series. Thus, instead of losing the full difference in energy between the birth potential of the particle and the potential in the core or outlet regions, only the difference in energy between the birth potential and the next lower energy element is lost.

Mono-Polar vs. Bipolar Biasing

Figure 12:
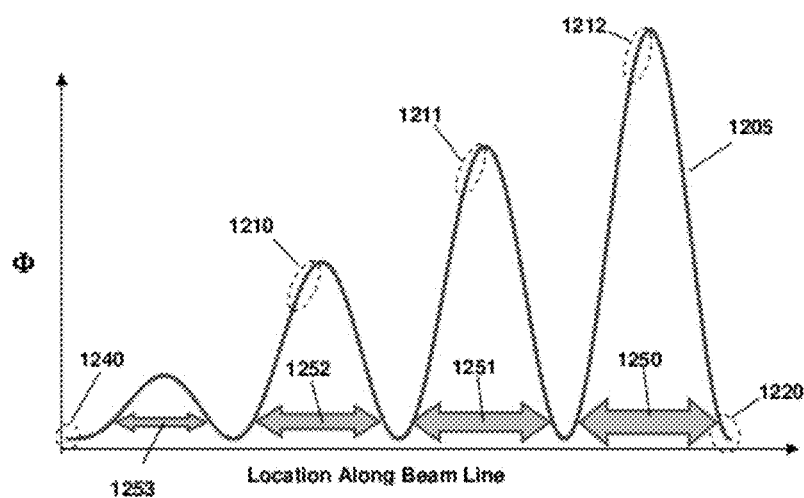
FIG. 12 is a plot of potential along a beam line for a multi-beam acceleration and focusing device for multiple positively charged particle beams and capable of confining multiple stable recirculating negatively charged particle beams about local potential maxima, according to an illustrative embodiment of the invention.

In certain embodiments of the invention, it may be desirable to create a potential profile where only positively charged particles or only negatively charged particles are accelerated to the outlet region or, in the case of recirculating charged particle traps, through the core region. Such architectures are described above. However, such systems may be tailored to have potential profiles such that charged particles are also confined on "local" recirculating orbits that do not pass through the outlet region, or in the case of charged particle traps, through the core region. The potential profile of an example case is shown in FIG. 12. The potential 1205 and the outlet region 1240 are noted. The positively charged particle introduction regions are pointed out as 1210, 1211, and 1212. The potential profile and the location of the introduction regions follow the rules described above such that ions introduced in each of the introduction regions are capable of reaching the outlet region 1240 with finite energy.

It is important to note that as the profile varies along the beam line, it repeatedly reaches local potential minima of approximately equal value and, in the case depicted in FIG. 12, the outlet region 1240 is also equal to the potential of these minima. A negative particle introduction region 1220 is noted. For example, if an electron is introduced to region 1220 at potential slightly more positive than that of the outlet region 1240, then the electron will not have sufficient energy to reach the outlet region. Instead, the electron will be confined to an orbit within a local recirculation region 1250. If a population of electrons (or other negatively charged particles) is recirculating in region 1250, collisions (also referred to as scattering) between particles will inevitably occur given sufficient time. Such scattering collisions will result in some particles gaining enough energy (i.e. up-scattering) so that they may escape the local recirculation region 1250, and some of those particles may travel to local recirculation regions 1251, 1252, etc. The turning points of these local recirculation regions may be considered to be virtual cathodes, i.e. sources of low energy electrons. In turn, scattering collisions will also result in a population of particles that lose energy (down-scattering), thus confining those particles more deeply within their respective local recirculation regions. In this way, a single negative particle introduction region may eventually populate multiple local recirculation regions. Additional separate negative particle introduction regions may be used to populate each local recirculation region individually or in subsets.

Figure 13:
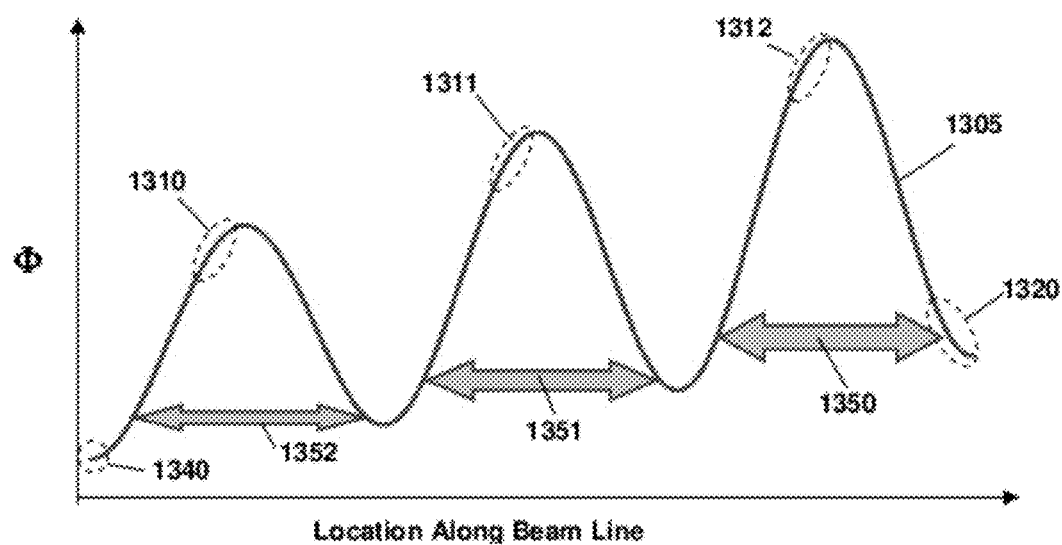
FIG. 13 is a plot of potential along a beam line for a multi-beam acceleration and focusing device for multiple positively charged particle beams and capable of confining multiple stable recirculating negatively charged particle beams about local potential maxima, according to an illustrative embodiment of the invention.

The profile does not need to come to exactly the same minima at each point (or in the converse case with locally recirculating positively charged particles, maxima). As long as a sufficient number of up-scattered particles are generated with sufficient energy to escape their local regions of recirculation and cross into both adjacent regions, all the local regions may be populated. This is illustrated in FIG. 13. The potential profile 1305 is noted, and the positive particle introduction regions are labeled 1310, 1311 and 1312. The outlet region is 1340, and the negative particle introduction region is 1320. The local recirculation regions are labeled 1350, 1351 and 1352 respectively. Due to combinations of up-scattering and down-scattering, negatively charged particles introduced at introduction region 1320 will eventually be able to populate, at least to some extent, local recirculation regions 1351 and 1352 even though local recirculation regions 1351 and 1352 are more negative than the negative particle introduction region 1320.

Figure 14:
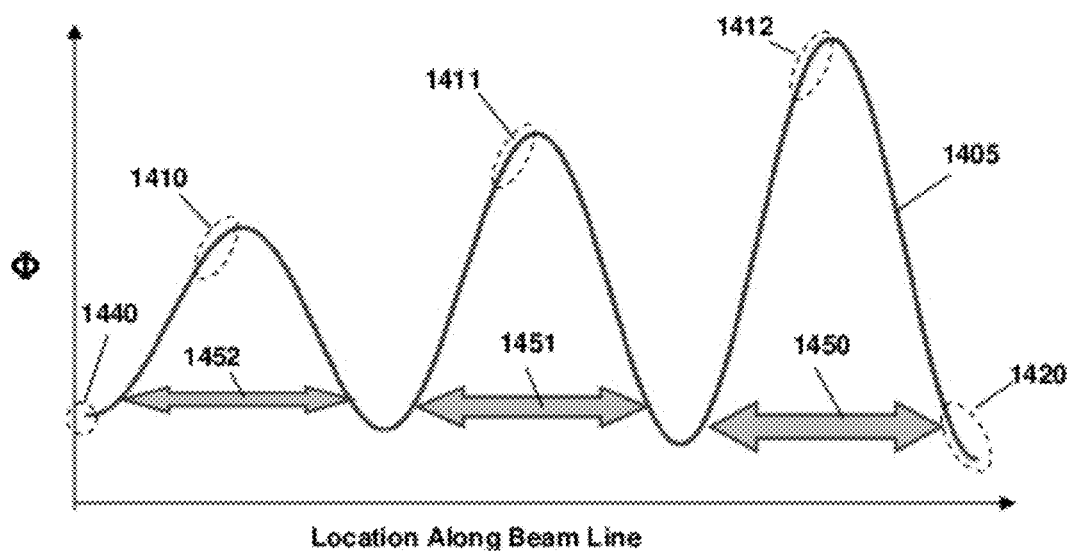
FIG. 14 is a plot of potential along a beam line for a multi-beam acceleration and focusing device for multiple positively charged particle beams and capable of confining multiple stable recirculating negatively charged particle beams about local potential maxima, according to an illustrative embodiment of the invention.

Down scattering can also be advantageously used to create a system in which particles of the same charge are both accelerated to the outlet region and confined in local regions of recirculation. The potential profile illustrated in FIG. 14 shows how this can be achieved for negative particles. As is the convention throughout, the potential profile on axis is labeled 1405. The positive particle introduction regions are shown as 1410, 1411 and 1412, and the negative particle introduction region is noted as 1420. The local regions of recirculation are noted as 1450, 1451 and 1452. Differences in the local maxima of potential are substantially larger than the differences in the local minima. Since each successive minima as one progresses away from the outlet region 1440 becomes more negative, particles introduced at such minima will be accelerated to the outlet region. However, down-scattered particles may also become confined in the local regions of recirculation. Reducing the differences in local minima reduces the amount of energy that must be lost in a down-scatter event in order for a particle to become confined within a local region of recirculation. Judicious design of the potential profile will allow control of the relative amounts of current confined in the local regions of recirculation versus current accelerated through to the outlet region.

Presented here are several extensions of the above approach. First, the converse of the approach also works where the profile is such that negative particles pass directly to the outlet region, while positive particles are confined in local recirculation regions. Second, the system may be mirrored about the outlet region to create a charged particle trap where multiple beams of one charge are recirculating through a core region, while beams of the opposite charge are confined on locally recirculating orbits that do not pass through the core. Third, to at least some extent, combinations of up-scattering and down-scattering will often lead to particles of both charges being confined in local regions of recirculation, and the amount of such trapping can be controlled by careful control of the potential profile. Fourth, the above technique can be extended to include an arbitrary number of beams passing through the core region and/or outlet region, and also to include an arbitrary number of local recirculation regions. Fifth, any given local recirculation region may be have variations of potential profile to allow multiple smaller regions of local recirculation within it. Thus, in the case of an ion trap, each region of local recirculation can look similar to the profile of the overall trap, i.e. the potential profile can follow a fractal-like self similarity down to an arbitrary order.

Figure 15:
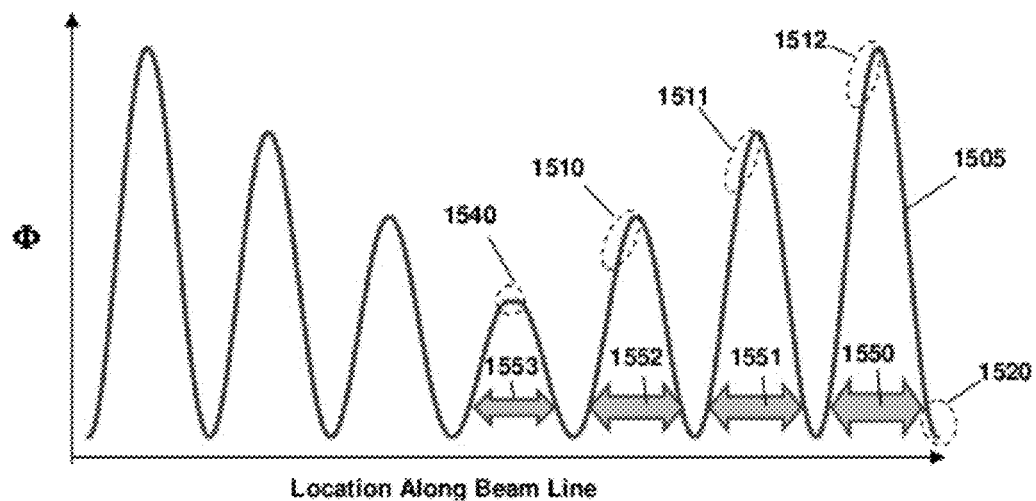
FIG. 15 is a plot of potential along a beam line for a multi-beam charged particle trapping device for multiple positively charged particle beams recirculating through the core region and capable of confining multiple stable recirculating negatively charged particle beams about local potential maxima, according to an illustrative embodiment of the invention.

In the case of recirculating charged particle traps using the above technique, charged particles of one polarity recirculate through the core region. Particles of the opposite polarity are typically confined in local recirculating regions that do not pass through the core region. However, it is possible to tailor a potential profile wherein one of the "local" regions of recirculation actually includes the core region. Such a system is illustrated in FIG. 15. The potential profile is labeled as 1505, and the positive particle introduction regions are shown as 1510, 1511, and 1512. The negative particle introduction region is noted as 1520, and the core region is denoted as 1540. The regions of local recirculation are highlighted as 1550, 1551, 1552, and 1553. As can be seen, negative particles in local recirculation region 1553 actually pass through the core region. This specific approach can be useful to neutralize other positive beams that may be passing through the core region. The converse system may also be constructed wherein the potential profile is tailored to confine positive particles within local recirculation regions while one or more negative particle beams recirculate about the core region.

Penning-Type Confinement of Low Energy Particles

The above-described approaches of particle confinement have been limited to confining particles of finite energy on stable orbits via the use of electrostatic focusing optics. Such systems typically require that particles have specific energies to be confined on stable orbits. Particles with too much or too little energy will be lost. The approaches described above allow multiple beams at different energy levels, and in some cases, different charges, to all be confined within the same system. In these systems, each beam has a specific range of energies that will be stable. The transverse energy component (i.e. energy perpendicular to the beam line axis) also must fall within a certain range for a give beam to be stably trapped. In other words, each beam occupies a region of stability in phase space. Particles that do not fall within one of the regions of stability that may exist for a given optical configuration will be lost.

However, low energy particles can also be well confined by adding a solenoidal magnetic field that is substantially parallel to the beam line near the potential extrema of the arrangement. For example, near a potential maximum, electrons can be axially confined by the potential and radially confined by a coaxially oriented magnetic field. For example, particle traps, such as Penning traps may be implemented. Penning traps confine particles of a particular polarity using both magnetic and electrostatic elements. If the magnetic field and electrostatic potential well are sufficiently strong, particles below a specific energy threshold can be confined for very long periods. Such systems work particularly well for electrons because their mass-to-charge ratio is very low and they are thus strongly affected by magnetic fields (as compared to more massive ions).

Because the potential profiles contemplated herein typically (but not always) have local maxima and minima, adding Penning trapping to the existing strong focusing trapping modes is relatively straightforward to implement. This allows trapping of low energy electrons near the potential maxima. Importantly, such Penning confinement regions can be made to overlap the positive particle introduction regions described above (use of such co-location for local ionization is described below). This is shown schematically in FIG. 16. The potential profile 1605 is noted along with the positive particle introduction regions 1610, 1611, and 1612, the negative particle introduction region 1620, and the outlet region 1640. Also noted are the Penning confinement regions 1660, 1661 and 1662. Such Penning confinement requires that a magnetic field that is substantially parallel to the beam axis be present throughout the volume of the Penning confinement regions. The polarity of the magnetic field is not important. It should be noted that, in some embodiments, there may not exist a clear delineation between those particles confined by Penning confinement and those particles confined in stable recirculating orbits about a local potential maxima or minima. The magnetic field changes the optics of the beams in the stacked electrodes, particularly in the turning regions of individual beams. The magnetic field can be used to augment the focusing action of the electrostatic electrodes, and to optimize the focusing of the beams. With a magnetic field, particles with a wider range of energies may be confined within the local recirculation region.

Figure 16:
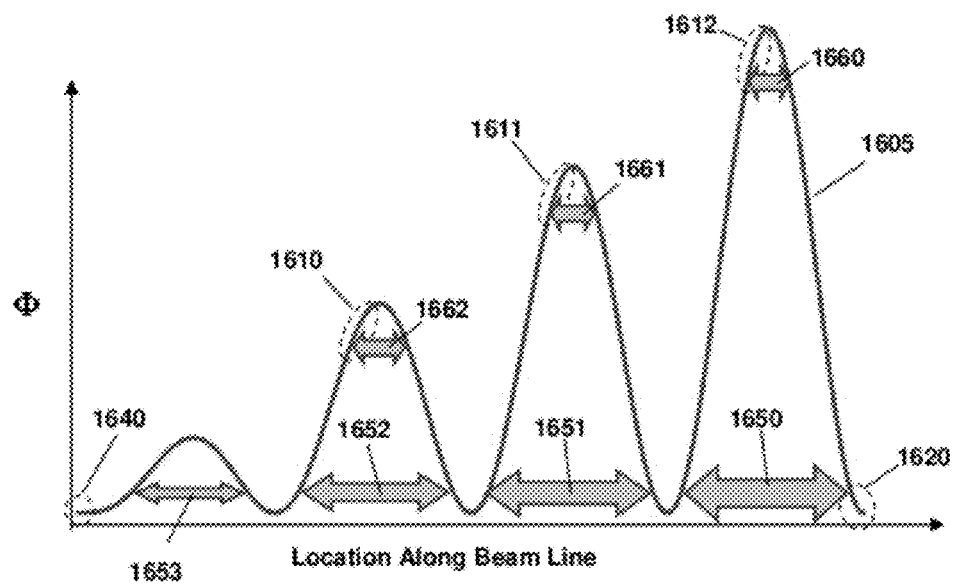
FIG. 16 is a plot of potential along a beam line for a multi-beam acceleration and focusing device for multiple positively charged particle beams and capable of confining multiple stable recirculating negatively charged particle beams about local potential maxima and capable of confining multiple populations of negatively charged particles in Penning confinement regions about local potential maxima, according to an illustrative embodiment of the invention.
Figure 17:
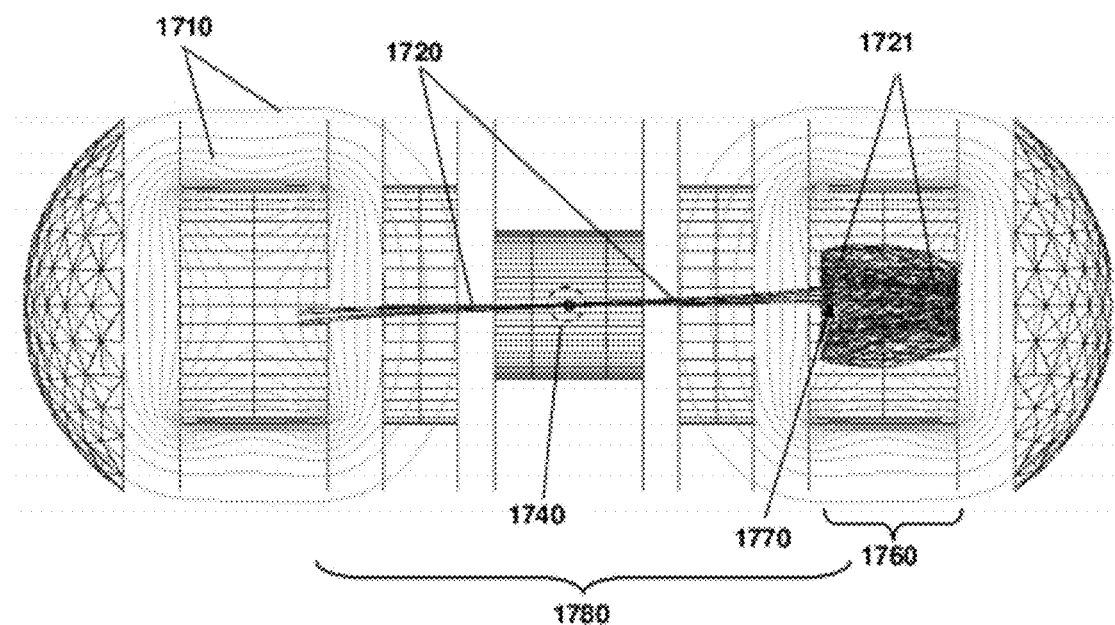
FIG. 17 is graphical output of a cylindrically symmetric computational simulation for a multi-beam charged particle trapping device confining a positively charged particle beam recirculating through the core region and an electron population confined within a local Penning confinement region about a local potential maxima, according to an illustrative embodiment of the invention.

As can be seen in FIG. 16, the positive particle introduction regions overlap the Penning confinement regions. Such overlap can also be seen in FIG. 17. As with the previous examples, FIG. 17 shows the output of a cylindrically symmetric computational model. In this case, the model shows both ions 1720 which are electrostatically confined on stable orbits through the core region and electrons 1721 confined within a Penning confinement region 1760. Lines of constant magnetic field strength 1710 are illustrated for reference. The magnetic field is substantially parallel to the beam axis near the Penning confinement region. The core region is denoted as 1740. The potential profile and focusing methodology is as described above. This example system is designed so that the ion orbits overlap the Penning confinement region in overlap region 1770.

Sourcing Charged Particles

There are multiple methods of introducing charged particles into the particle introduction regions described above. Charged particles may be introduced directly into such regions with little or no kinetic energy, or they may be introduced into the system in the form of beams, accomplished with a temporary switching of electrode potentials that allows said beams to enter the scenario. Charged particles may be sourced from any suitable ion and/or electron source, and many such sources are well known in the art. Where multiple beams share the same beam line, care must be taken to assure that the physical hardware of the particle source for a given beam does not block other beams that are passing through the particle introduction region. This can be accomplished by locating the source off the beam line axis. In the case of a trapping implementation, a typical charged particle emitted in this way performs numerous passes through the device before it has an opportunity to collide with the structure from which it sprung, because it traces out a surface upon reflection which is centered on the axis, e.g. it turns at points where no physical structure is nearby. In this manner, charged particles from small, off axis emission structures can substantially fill the trap, and said emission structures do not interfere with the other beams whose turning points lie near a different electrode, e.g. beams passing through the arrangement coaxially.

In certain embodiments, charged particles are directly created with near-zero kinetic energy within the reflection regions of the trap by ionization of a neutral gas. In this way, it can be assured that charged particles are always located relatively far from any solid physical elements of the system. In the trap embodiments of the present invention, with charged particles oscillating from one end of the trap to the other, particles on stable orbits, subject to conservative electromagnetic fields, will eventually return arbitrarily close to their birth position in phase space. Small changes in trajectories due to non-conservative forces (such as resulting from collisions with other particles or radiation) imply that particles will generally return near their birth potential/location, but not exactly. Therefore, introduction of particles far from any physical structure is advantageous, because particles are very unlikely to contact such structures when experiencing small non-conservative perturbations in their motion. Thus, in certain embodiments, charged particles are created well away from physical elements by ionization of a neutral gas that may be present about the beam line. Such ionization can be achieved through several different means, e.g. electrical discharge, electron impact ionization, or bombardment by photons of appropriate energy and intensity.

In certain embodiments, charged particles are created well away from physical elements by ionizing a neutral gas that may be present about the beam line, whereby such ionization is accomplished by means of collisions with electrons. If a neutral gas atom or molecule is impacted by an electron of sufficient energy, the atom or molecule will be partially or in some cases fully ionized. This generates one or more ions, and one or more free electrons. As has been discussed above, electrons may be confined along the beam line either through stable electrostatic trapping, or through Penning confinement, or a combination of both effects. Moreover, such regions of good electron confinement can be arranged so that they overlap the ion introduction regions.

As an example, FIG. 17 shows a trapped ion beam 1720 and a Penning-confined population of electrons 1721. Importantly, the ion orbit region 1780 (defined by the axial extent of the ion trajectories in the recirculating beam) and the Penning confinement region 1760 overlap at the overlap region 1770. Thus the ion introduction region lies, at least partially, within the local Penning Confinement region. This in turn allows ions, created by collisions between electrons 1721 confined in the Penning confinement region 1760 and neutral gas molecules that may be introduced about the Penning confinement region, to be stably trapped in the recirculating ion beam 1720.

This may be extended to multiple ion beams, each turning within its own Penning confinement region, at least partially overlapping each beam's respective particle introduction region. Because such Penning confinement regions do not comprise solid structures, they do not present a barrier to other beams of higher energy that may be passing through this local region of the beam line. Thus, multiple beams and multiple Penning confinement regions may be stacked in series along a common beam line.

Because a neutral gas represents not only a potential source of charged particles but also to some extent an obstruction to beam particles (charge-exchange and other types of collisions with neutrals result in loss of beam particles or their energy), engineering means for optimizing the beneficial effects of the presence of neutral gas, and mitigating the deleterious effects can be implemented. For example, gas introduction and vacuum pumping methods which localize peak neutral densities near the preferred ionization regions and minimizes gas densities elsewhere can be used.

The optical properties of the beam line will determine the axial and radial extents where ions may be introduced to a given beam and still be stably trapped. Such extents effectively define the charged particle introduction regions described above. In order to confine the maximum useful current in a given beam, the optical properties of the system are designed such that both the volume of the particle introduction region is maximized and volume of the overlap region with the Penning confinement region is maximized. In addition, those portions of the Penning ionization region that do not overlap the preferred ion introduction region should be minimized, since ions born there do not lie in the acceptance volume of phase space for proper focusing (and, if operated as a trap, for stable orbits). Such ions are quickly lost to the electrodes comprising the system.

Optical Design Considerations

The efficient design of the electrostatic potential profile can benefit any of the above systems. Almost any potential profile following the above rules will focus and/or confine at least one beam at some energy near the beam axis itself. However, focusing/trapping a finite range of energies for a given beam, and accommodating trajectories that are not precisely collinear with the beam axis requires judicious design.

In charged particle optical systems, an important metric is the tolerated acceptance angle of particle trajectories, which is the maximum angle between a particle's velocity and the beam axis where the particle will remain focused and/or trapped, at a point along the beam axis where particles are crossing. Aside from the "adequate" focusing/trapping criterion, there are additional concerns regarding the quality of the focus and/or trapping, which have to do with aberrations and emittance. For example, spherical aberrations in an optical system describe the fact that a set of particles which diverge from a point on the beam axis to be focused differently from each other, depending on the angle of the trajectory of each particle. Minimization of spherical aberrations is often desirable, to focus maximum beam current onto a minimum spot-size. Also, in some trapping applications, a wide acceptance angle is beneficial, e.g. in situations where space charge of the beam is problematic where the beam is slower. A wide acceptance angle may also be useful in single pass accelerator applications for similar reasons.

Another important metric is the range of energies that may be optimally focused or stably trapped in a given beam. This is important for certain embodiments discussed above where a large range of energies for a single beam translates into a large acceptable particle source region and, in the case of trap implementation, a reflection region with a large volume, i.e. with particle turning surfaces well separated in proportion to particle energy differences.

Various methods for correcting spherical and chromatic aberration in ion optical systems may be applied in certain embodiments of this invention. For example, an arrangement such as described in FIG. 10 bears some discussion. In such a system, a beam with a source region (or reflection region) at location 1021 experiences a focus when passing through each local maximum of the potential along the axis. In effect, electrodes which create such a potential constitute a series of immersion lenses. The electrodes can be biased and spaced (and, optionally, shaped) so that the spherical and chromatic aberration coefficients for each lens are matched by coefficients in the source/reflection region, which are of opposite sign as the immersion lenses. That is to say, a collection of particles with similar but not identical energies passing through the turning/source regions of beams with substantially lower energies are focused in a way such that those particles with slightly higher energies than the average will have a longer focal length. When these same particles are traveling in their source region (or, upon entering their reflection region), the particles with slightly higher energies generally experience stronger focusing and thus have shorter focal lengths. The system may be optimized to correct for chromatic aberrations in a way that broad bands of energies are well focused (or trapped) in the present invention. The same holds true for spherical aberrations, where again the aberration coefficients of the electrostatic mirror and the immersion lens have opposite sign, in general. For example, certain methods described in the following references may be applied: [G. F. Rempfer, *Journal of Applied Physics* 67, pg 6027 (1990); V. A. Zhukov, *Russian Microelectronics* 35, pg 372 (2006)]. When a co-axial magnetic field is applied to the device, the optics of charged particles can be changed significantly, which also aids the designer with additional freedom in the optimization of a particular embodiment.

EQUIVALENTS

While the invention has been particularly shown and described with reference to specific embodiments, it should be understood by those skilled in the art that various changes in form and detail may be made therein without departing from the spirit and scope of the invention as defined by the appended claims. The features and functions of the various embodiments may be arranged in various combinations and permutations, and all are considered to be within the scope of the disclosed invention. The relevant teachings of all the references, patents and patent applications cited herein are incorporated herein by reference in their entirety.

What is claimed is:

1. A system for generating, accelerating, focusing, and/or trapping of particle beams, the system comprising a plurality of electrostatic and/or magnetic focusing elements arranged along a beam line and a plurality of positively charged particle introduction regions arranged along said beam line such that, during operation, one or more of the following holds: (i) the potential of each successive positive particle introduction region is substantially more positive than any other potential along the beam line in the direction of outlet region; (ii) the positive particle introduction regions lie about and toward the outlet region of a local maxima in potential on the beam line; (iii) the potential between one or more adjacent pairs of positive particle introduction regions falls to one or more local minima; and/or (iv) all local minima in potential along the beam line are substantially the same.

2. The system of claim 1, configured such that, during operation, all local minima are substantially equal to the potential of the outlet region.

3. The system of claim 2, configured such that, during operation a source of electrons is provided at a potential minima furthest from the outlet region.

4. The system of claim 3, configured such that, during operation, electrons are confined on local recirculating orbits between adjacent potential minima.

5. The system of claim 1, further comprising one or more magnetic elements configured to generate a magnetic field that is substantially parallel to at least a portion of the beam line.

6. The system of claim 5, configured such that, during operation, at least some electrons are confined in Penning confinement regions about one or more local potential maxima.

7. The system of claim 4, configured such that, during operation, electrons create ions through impact with neutral gas.

8. The system of claim 6, configured such that, during operation, electrons create ions through impact with neutral gas.

9. The system of claim 7, configured such that, during operation, said created ions are created in locations where they can be accelerated and focused to the outlet region.

10. The system of claim 1, mirrored about the outlet region such that, during operation, one or more beams are at least partially confined on stable recirculating orbits traveling through a core region.

11. The system of claim 10, configured such that, during operation, two or more beams of opposite polarity are at least partially confined on stable recirculating orbits traveling through the core region.

12. A method for generating, accelerating, focusing, and/or trapping particle beams, the method comprising introducing charged particles into a beam line, wherein a plurality of electrostatic and/or magnetic focusing elements are arranged along the beam line and a plurality of positively charged particle introduction regions are arranged along the beam line such that one or more of the following holds: (i) the potential of each successive positive particle introduction region is substantially more positive than any other potential along the beam line in the direction of outlet region; (ii) the positive particle introduction regions lie about and toward the outlet region of a local maxima in potential on the beam line; (iii) the potential between one or more adjacent pairs of positive particle introduction regions falls to one or more local minima; and/or (iv) all local minima in potential along the beam line are substantially the same.

13. The method of claim 12, wherein all local minima are substantially equal to the potential of the outlet region.

14. The method of claim 13, wherein a source of electrons is provided at a potential minima furthest from the outlet region.

15. The method of claim 14, wherein electrons are confined on local recirculating orbits between adjacent potential minima.

16. The method of claim 12, further comprising the step of generating a magnetic field that is substantially parallel to at least a portion of the beam line.

17. The method of claim 16, wherein at least some electrons are confined in Penning confinement regions about one or more local potential maxima.

18. The method of claim 15, wherein electrons create ions through impact with neutral gas.

19. The method of claim 17, wherein electrons create ions through impact with neutral gas.

20. The method of claim 18, wherein said created ions are created in locations where they can be accelerated and focused to the outlet region.

21. The method of claim 12, wherein one or more beams are at least partially confined on stable recirculating orbits traveling through a core region.

22. The method of claim 21, wherein two or more beams of opposite polarity are at least partially confined on stable recirculating orbits traveling through the core region.

* * * * *